United States Patent [19]

Tsou

[11] Patent Number: 5,240,875
[45] Date of Patent: Aug. 31, 1993

[54] SELECTIVE OXIDATION OF SILICON TRENCH SIDEWALL

[75] Inventor: Len-Yuan Tsou, New City, N.Y.

[73] Assignee: North American Philips Corporation, New York, N.Y.

[21] Appl. No.: 929,086

[22] Filed: Aug. 12, 1992

[51] Int. Cl.[5] .............................. H01L 21/76
[52] U.S. Cl. ......................... 437/72; 437/69; 437/979; 148/DIG. 50; 148/DIG. 117; 148/DIG. 163
[58] Field of Search ............ 437/67, 72, 979, 69; 148/DIG. 50, DIG. 51, DIG. 117, DIG. 163

[56] References Cited

U.S. PATENT DOCUMENTS

| | | | |
|---|---|---|---|
| 4,437,226 | 3/1984 | Soclof | 148/DIG. 51 |
| 4,514,251 | 4/1985 | Van Ommen et al. | 437/228 |
| 4,756,793 | 7/1988 | Peek | 437/67 |
| 4,772,569 | 9/1988 | Ishii et al. | 437/67 |
| 5,182,227 | 1/1993 | Matsukawa | 437/72 |

FOREIGN PATENT DOCUMENTS 0064336 3/1989 Japan.

Primary Examiner—Tom Thomas
Assistant Examiner—Trung Dang
Attorney, Agent, or Firm—Paul R. Miller

[57] ABSTRACT

The present invention is directed to a technique for selectively oxidizing trench side walls in a silicon substrate. Each of the side walls can be oxidized individually and to different thicknesses according to the requirements of the trench IC.

8 Claims, 1 Drawing Sheet

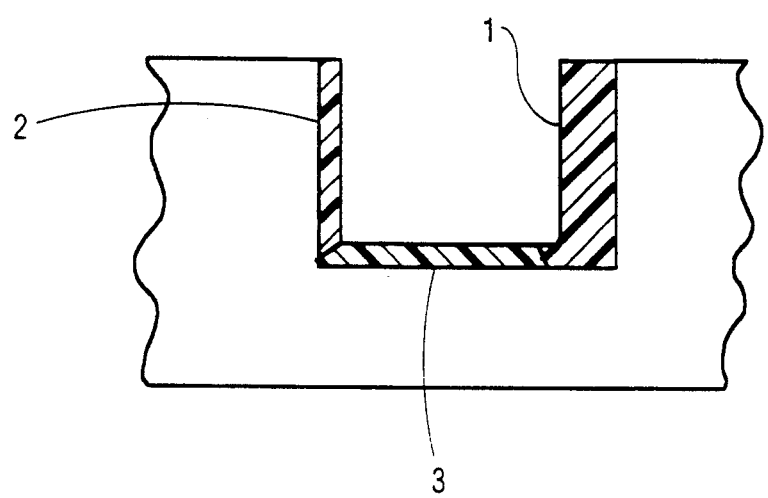

SELECTIVE OXIDATION OF SILICON TRENCH SIDEWALL

The present invention involves selective oxidation of the side walls of trenches formed in, for example, silicon wafers. In particular, the technique of the present invention enable selective oxidation growth on different trench walls at different thicknesses, as well as provides a selective oxide growth on the bottom surface of the trench.

BACKGROUND OF THE INVENTION

Because of the requirements in semiconductor technology to form integrated circuits (IC's) with higher and higher integration densities, trench technology in IC's has attracted much attention. This technology offers additional device areas and an extra degree of freedom in designing semiconductor devices. Such technology in designing semiconductor devices may be seen, for example, in U.S. Pat. Nos. 4,437,226 or 4,756,793, as well as Japanese Patent Application No. 1-64336 A.

These references involve providing films on trench side walls for semiconductor devices.

Moreover, the concept of selective etching has been considered in the prior art, such as seen, for example, in Japanese Application No. 1-64336 A as well as U.S. Pat. No. 4,514,251. These various references involve various techniques for forming features in semiconductor technology which provides a basis for accomplishing the presently claimed invention. For example, while the various references discuss oxidation of trench surfaces, nowhere is there any discussion of providing selective growth of oxidation layers at different side walls of the trenches. This knowledge occurs from the present application.

SUMMARY OF THE INVENTION

The present application is directed to a technique for selectively oxidizing trench walls for use in semiconductor devices.

The invention involves the use of forming a first oxide layer over the entire surface area of a trench, depositing a silicon nitride coating over the first oxide layer, removing a portion of the silicon nitride over a selected side wall of the trench to expose the first oxide, and then etching the exposed portion of the first oxide layer and selectively oxidizing the etched and exposed portions to a second thickness different from the first thickness. These steps can be repeated to selectively oxidize different side walls of the trench at different thicknesses.

This technique can be carried out by various ways of removing silicon nitride, such as, for example, by ion milling or reactive ion beam etching (RIBE).

In addition, the technique of removing the silicon nitride portion may occur by first damaging a selected portion by an ion implant, and then by etching the damaged portion. It has been found that ion bombardment using boron, B+, ions at various implant energies results in selective etching at about twice the rate of etching without the ion bombardment.

The ion bombardment may occur at various energies, such as 40 keV, 80 keV, or 120 keV, for example. In addition, the etching of the damaged portion is effectively carried out in hot phosphoric acid ($H_3PO_4$). This etch is especially effective at temperatures, such as about 150° C.

The ion bombardment for damaging a nitride layer on a trench side wall, or selective etching by ion milling or RIBE, is carried out at tilted angles relative to the exposure in the trench. Such angles of ion bombardment may be determined by the width and depth of the trench. These angles may vary up to about 45°, for example.

BRIEF DESCRIPTION OF THE DRAWING FIGURES

The present invention may be seen by reference to the attached drawing FIG. 1 which shows without limitation an example of the structure obtained during carrying out the present invention.

The drawing is a generalized drawing and is not made to scale dimensionally although it shows differences in side walls oxidation thicknesses.

DESCRIPTION OF THE INVENTION

The selective oxidation of trench side walls in semiconductor wafers, such as silicon wafers makes use of the technique of growing a first oxide layer over the entire trench surface area. This first oxide layer is grown to a thickness which may be denominated as TO1. Thereafter, silicon nitride is deposited over the first layer of oxide in the trench by chemical vapor deposition (CVD).

A selected side wall of the trench is determined and this side wall is damaged by way of an ion implantation, for example, at a predetermined angle to cover the area of the side wall. Thereafter, the damaged portion of the silicon nitride is etched by a wet etch such as, for example, phosphoric acid ($H_3PO_4$). This etching of the damaged nitride portion occurs at a rate that is twice that of the etching of non-damaged areas in the same etchant. It therefore leaves about ⅓ of the non-damaged nitride while removing the damaged nitride.

The exposed first oxide layer is then wet etched and selectively oxidized to a target thickness, such as TO2, where TO2 is greater than TO1. Thereafter, the remaining nitride is wet etched, and the oxide at a thickness of TO1 is then wet etched. This oxide can be thermally regrown to another thickness $TO1_i$, while the thickness TO2 becomes a third thickness TO3.

These latter steps are optional, and may not be necessary for achieving appropriate oxidized trench side walls.

The carrying out of the steps of damaging a selective side wall and then wet etching this damaged surface may be carried out in one step, such as by ion milling, or by reactive ion beam etching (RIBE).

The result of this may be seen by reference to the drawing figure in which one side wall 1 of the trench may have a oxide layer of about 2500 angstroms in thickness, while another trench side wall 2 may have an oxide of about 1000 angstroms in thickness.

This technique can be repeated at various side walls of the trench, as well as the bottom 3 of the trench. In this manner, the various side and bottoms can each be formed with respective different thicknesses of an oxide layer.

What I claim is:

1. A method for selectively oxidizing trench walls comprising the steps of
    (a) growing a first oxide layer over entire surface area of a trench to a first thickness, (b) depositing silicon nitride over said first oxide layer, (c) removing a portion of said silicon nitride over a selected side wall of said trench to expose said first oxide, (d) etching the exposed portion of said first oxide layer, and (e) selectively oxidizing said etched and exposed portions to a second thickness different from said first thickness.

2. A method according to claim 1, wherein said steps (c)–(e) are repeated to selectively oxidize different side walls of said trench at different thicknesses.

3. A method according to claim 1, wherein said step (c) is carried out by one of ion milling or reactive ion beam etching (RIBE).

4. A method according to claim 1, wherein said step (c) is carried out by first damaging said portion with ions and then by etching the damaged portion.

5. A method according to claim 4, wherein said step of first damaging is carried out by ion, bombardment with boron ions.

6. A method according to claim 5, wherein said ion bombardment is carried out at 40 keV, 80 keV or 120 keV.

7. A method according to claim 4, wherein said etching of said damage portion is carried out in hot $H_3PO_4$.

8. A method according to claim 1, wherein said step (c) is carried out by ion bombardment at a predetermined angle.

* * * * *